United States Patent
Clarke et al.

(10) Patent No.: US 7,098,093 B2
(45) Date of Patent: Aug. 29, 2006

(54) HEMT DEVICE AND METHOD OF MAKING

(75) Inventors: Rowland C. Clarke, Sykesville, MD (US); Michael E. Aumer, Columbia, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/938,602

(22) Filed: Sep. 13, 2004

(65) Prior Publication Data

US 2006/0057790 A1 Mar. 16, 2006

(51) Int. Cl.
*H01L 21/338* (2006.01)

(52) U.S. Cl. ............... 438/172; 438/170; 438/173

(58) Field of Classification Search ............ 438/172, 438/173, 170, 189, 312, 202, 309, 327
See application file for complete search history.

(56) References Cited

U.S. PATENT DOCUMENTS

| 4,839,310 A | * | 6/1989 | Hollis et al. | 438/173 |
| 2003/0205721 A1 | * | 11/2003 | Nishii et al. | 438/522 |

* cited by examiner

*Primary Examiner*—Walter L. Lindsay, Jr.
(74) *Attorney, Agent, or Firm*—Birch, Stewart, Kolasch & Birch, LLP

(57) ABSTRACT

A HEMT type device which has pillars with vertical walls perpendicular to a substrate. The pillars are of an insulating semiconductor material such as GaN. Disposed on the side surfaces of the pillars is a barrier layer of a semiconductor material such as AlGaN having a bandgap greater than that of the insulating material of the pillars. Electron flow is confined to a narrow channel at the interface of the two materials. Suitable source, drain and gate contacts are included for HEMT operation.

7 Claims, 9 Drawing Sheets

HEMT DEVICE AND METHOD OF MAKING

BACKGROUND OF THE INVENTION

1. Field of the Invention

The invention in general relates to high power microwave devices.

2. Description of Related Art

In the field of microwave electronics a need exists for a high power, high frequency transistor. A widely used transistor for this purpose is the GaN (gallium nitride) based HEMT (high electron mobility transistor). The HEMT is a transistor which has a heterojunction formed between two semiconductor materials of different bandgaps. Current in such a device is confined to a very narrow channel at the junction, such current being known as a 2DEG (two dimensional electron gas).

Although the GaN based HEMT has many advantages over a GaAs (gallium arsenide) based HEMT it has several problems, one of which is the requirement for a prohibitively high substrate expense. That is, due to the thermal conductivity requirements of high power applications, SiC (silicon carbide) is used as the substrate for the layers comprising the HEMT.

A typical HEMT is structurally similar to a conventional, generally planar, field effect transistor and a particular insulating SiC substrate must be used. Such substrate can be an order of magnitude higher in cost than the widely used n+ SiC.

Accordingly, it would be desirable to have a HEMT type device which may be fabricated on an n+ SiC substrate thereby benefiting not only from the reduced substrate cost, but a higher device yield, due to the superior quality of n+ SiC substrates. It is a primary object of the present invention to provide such device.

SUMMARY OF THE INVENTION

A HEMT device in accordance with the present invention includes a substrate and a plurality of pillars, each having a top and each having sidewalls perpendicular to the substrate. The pillars are of an insulating semiconductor material having a certain bandgap. A barrier layer is disposed on at least the sidewalls of the pillars, with the barrier layer being of a semiconductor material having a bandgap greater than that of the pillars. Metal contacts are disposed on the tops of the pillars, on a surface of the substrate and on the barrier layer which is disposed on at least the sidewalls of the pillars.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
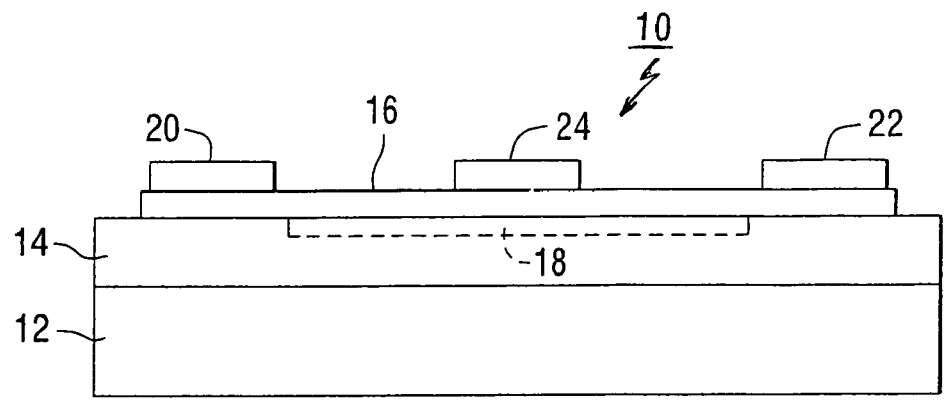
FIG. 1 illustrates a prior art HEMT device.

Referring now to FIG. 1, a typical high electron mobility transistor of the prior art is illustrated in simplified form. The HEMT 10 is comprised of a plurality of semiconductor layers including a substrate 12 on which is deposited an insulating layer 14 having a certain bandgap.

A higher bandgap barrier layer 16 forms a heterojunction with layer 14 whereby electrons are confined to a very narrow channel region 18 between source 20 and drain 22, as governed by the potential applied to control gate 24. Electrons travel, parallel to substrate 12, in channel 18 in a thin sheet known as a two dimensional electron gas. Superior results are obtained using a substrate 12 of a first chemical family in the form of insulating SiC, with an insulating layer 14 of a second chemical family in the form of GaN, and barrier layer 16 also of the second chemical family, in the form of AlGaN.

As mentioned, one problem with the device of FIG. 1 is the extremely high price of the SiC substrate 12. It must be grown with essentially zero impurities thus significantly adding to the fabrication costs involved in growing the SiC boule from which the substrate is obtained.

The present invention will initially be described, by way of example, with respect to a GaN based system on a SiC substrate, it being understood that the HEMT device may also be produced using a variety of alternative substrates or heterojunction materials.

Other chemical families, for example, a Si (silicon) substrate could be substituted for SiC. The lower thermal conductivity of Si may suffice for some applications, particularly when the need for lower substrate cost outweighs the need for maximized power availability. Further, the device could be made using GaAs based materials. While these alternatives may not outperform the GaN on SiC embodiment described herein, each alternative may find application for special purposes in addition to outperforming conventional devices within their respective materials technology.

Figure 2:
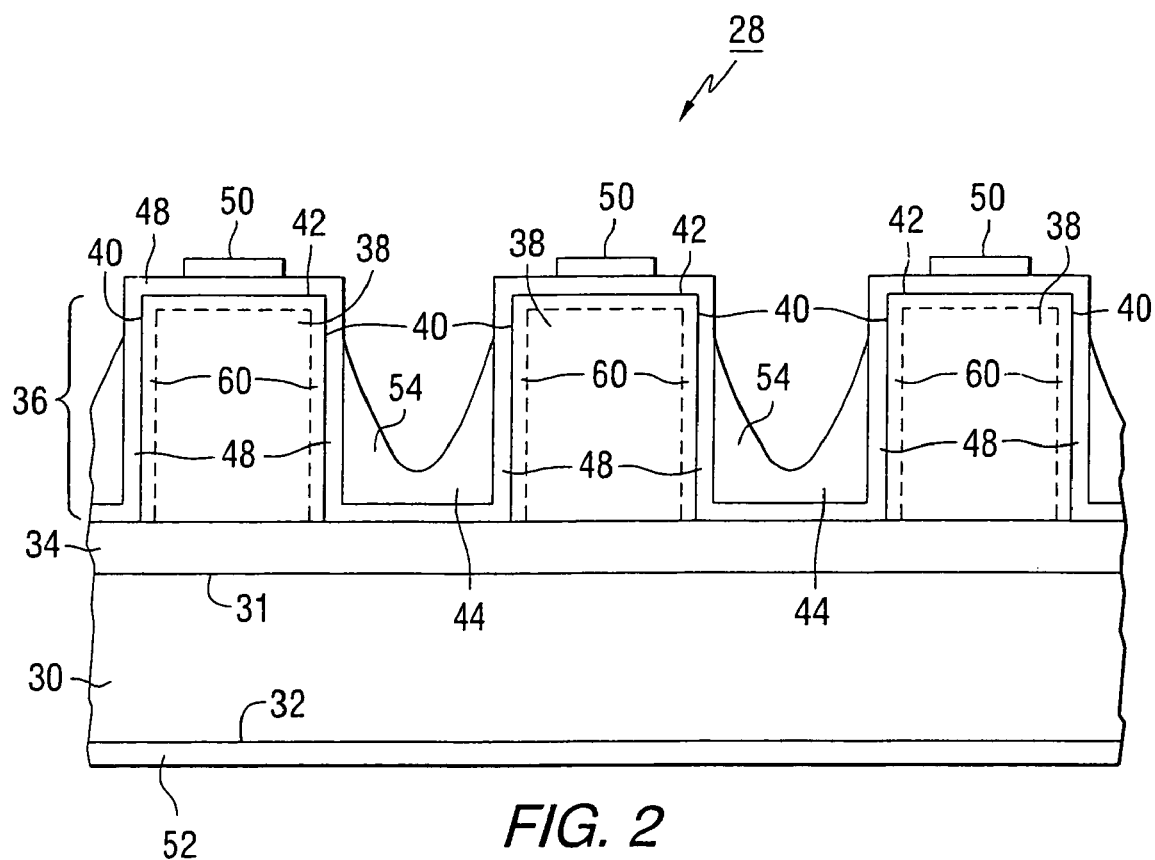
FIG. 2 illustrates one embodiment of the present invention.

The HEMT 28, of FIG. 2, illustrating one embodiment of the present invention, has a structure somewhat similar to a conventional SIT (static induction transistor) in that electrons flow perpendicular to the substrate, instead of parallel to it, as in FIG. 1. The HEMT 28 is comprised of a plurality of semiconductor layers, including a substrate 30, preferably of a first chemical family constituted by relatively inexpensive n+ SiC, and having first and second surfaces 31 and 32. Subsequent layers are of a second chemical family, GaN, which would include insulating GaN, n+ GaN, as well as GaN alloyed with such metals as Al (aluminum) and/or In (indium).

An n+ buffer layer 34 covers the first surface 31 of substrate 30 and is of the composition $Al_xIn_yGa_{(1-x-y)}N$ where $0 \leq x \leq 1$ and $0 \leq y \leq 1$. An insulating GaN layer 36 is deposited over the buffer layer 34 and this GaN layer may also include Al and or In. Insulating layer 36 is etched to form a plurality of pillars 38, of which three are shown, and which extend into the plane of the figure to define parallel fingers. Each pillar 38 includes vertical sidewalls 40 and top portion 42, with trenches 44 being defined between adjacent pillars.

A barrier layer 48, of AlGaN having a bandgap greater than that of pillars 38 (the insulating GaN), is deposited at least on the vertical sidewalls 40 of the pillars 38. For ease of fabrication, the barrier layer 48 also covers top portions 42 as well as trenches 44. Metal source contacts 50 are positioned on top of the pillars 38, more particularly, on top of barrier layer 48, and a metal drain contact 52 is positioned on the second surface 32 of substrate 30, opposite contacts 50. Control of current is achieved by metal gate contacts 54 deposited in the trenches 44 and contacting the vertical portion of barrier layer 48. It is to be noted that source contacts 50 and drain contact 52 may be interchanged such that drain contacts would be situated on the pillar tops while a single source contact would be located on the second surface 32 of substrate 30.

By virtue of the heterojunction structure between the insulating pillars 38 and barrier layer 48, electrons traveling from source contacts 50 to drain contact 52 are confined to a very narrow channel 60 at the interface of the pillars and barrier layer. This is in contrast to a conventional SIT wherein electron flow occupies the entire three dimensional volume of the pillar structure. Since current is confined to this narrow channel, a modulating voltage on the gate 54 has a greater effect than if the current occupied the entire pillar 38. Accordingly, more gain and operation at higher frequencies may be achieved with the device of the present invention. Additionally, the GaN/AlGaN heterojunction supports higher currents and higher breakdown voltages such that the device is also operable at higher power levels.

Fabrication of the HEMT device 28 is illustrated in FIGS. 3A to 3D. The fabrication will be described, by way of example, with respect to the MOCVD (metal organic chemical vapor deposition) process wherein gallium is derived from trimethylgallium, nitride from ammonia, aluminum from trimethylaluminum, and indium, if used, from triumethylindium.

Figure 3A:
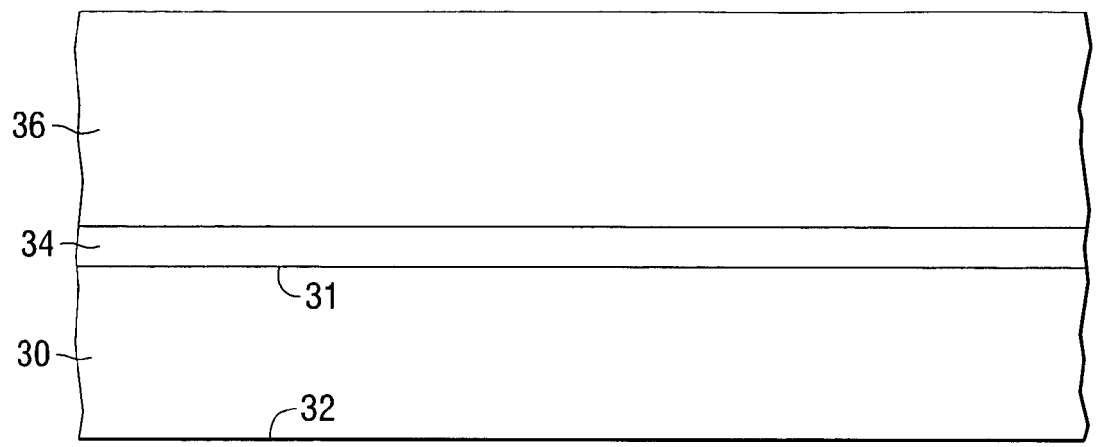
FIGS. 3A to 3D illustrate the fabrication steps for making the embodiment of FIG. 2.
Figure 3B:
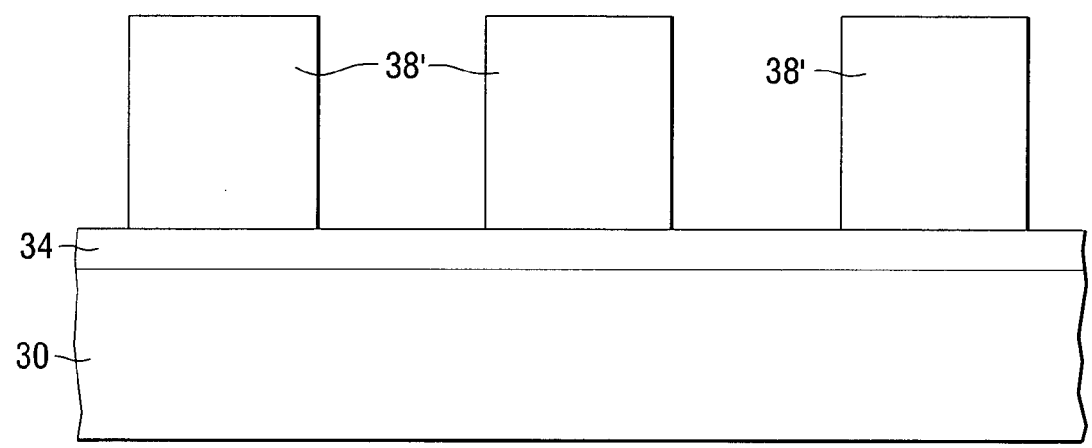

Substrate 30 is placed in the MOCVD growth apparatus and buffer and insulating layers 34 and 36 are grown, as illustrated in FIG. 3A. The structure is removed from the apparatus and etched to form pillars 38', as in FIG. 3B. The structure of FIG. 3B is again placed in the MOCVD growth apparatus to grow the remaining layers.

If the barrier layer 48 is then grown directly on pillars 38', there is danger of a high density of electron traps at the resulting interface which would tend to reduce available current. In order to prevent this, when the structure of FIG. 3B is again placed in the MOCVD growth apparatus to grow the remaining layers, a thin layer of the same, or similar, material as pillars 38' is grown over the surface of pillars 38', resulting in pillars 38. When a desired thickness is attained, equivalent to the thickness of channel 60 (FIG. 2), Al is introduced into the process to form the higher bandgap barrier layer 48, as in FIG. 3C. This additional thickness of insulating layer, corresponding to the channel 60, is small relative to the width of a pillar 38. For example, if the pillar width is tens of thousands of Angstroms, the channel width may be on the order of a couple of hundred Angstroms.

Figure 3C:
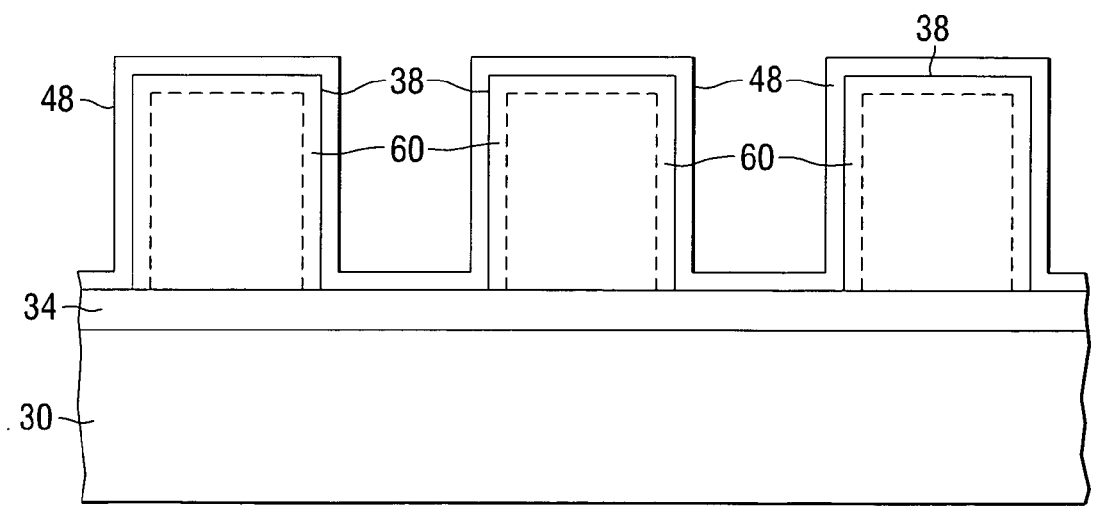
Figure 3D:
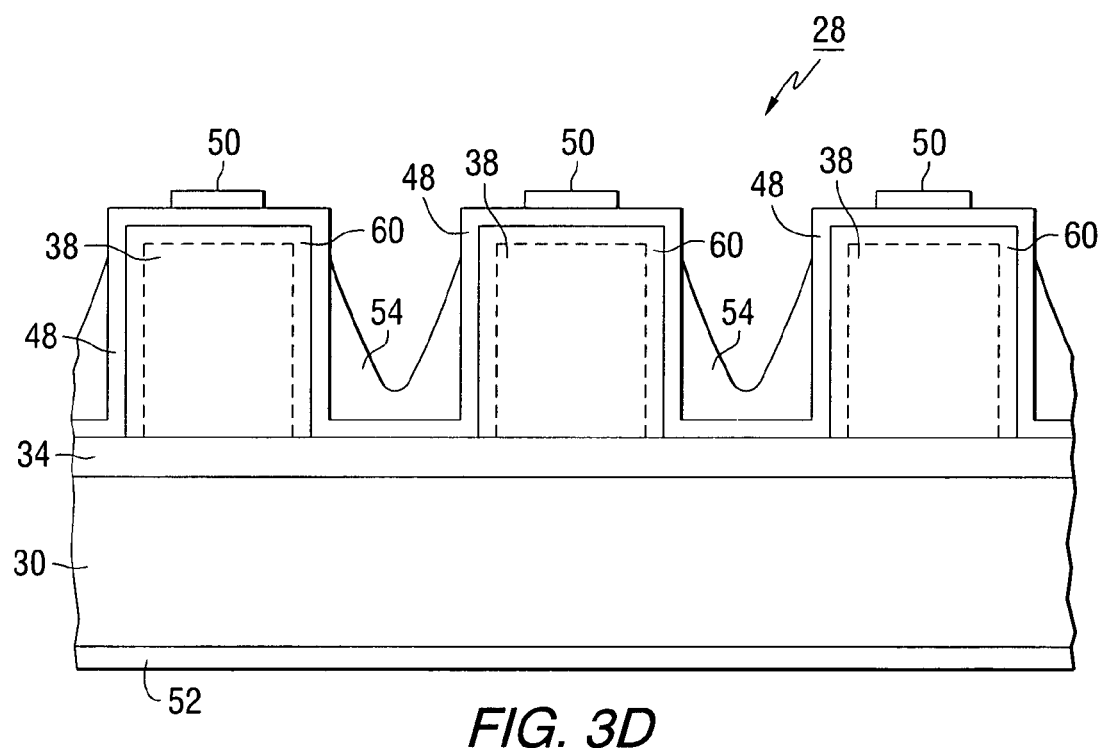

The structure of FIG. 3C is then subject to a series of metallization steps for applying metal source, drain and gate contacts 50, 52 and 54, as illustrated in the finished HEMT device 28 of FIG. 3D.

Figure 4A:
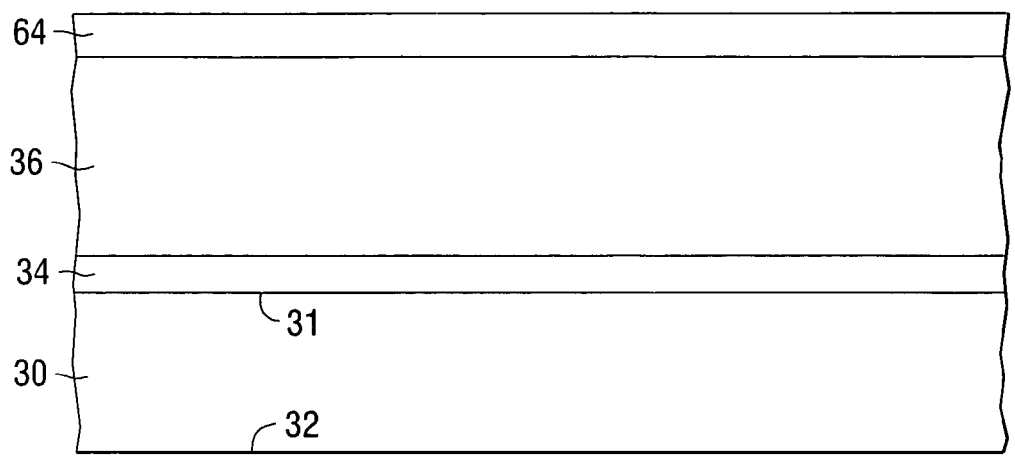
FIGS. 4A to 4E illustrate the fabrication steps for making an alternative embodiment of the present invention.

FIGS. 4A to 4E illustrate the fabrication of another embodiment of the present invention, and wherein components similar to those in FIGS. 3A to 3D have been given the same reference numerals. In FIG. 4A, buffer layer 34 is deposited on first surface 31 of substrate 30 and insulating layer 36 is formed over buffer layer 34. An additional layer 64 is placed on top of insulating layer 36 and is comprised of n+GaN to serve as a good source of electrons in the finished product.

Figure 4B:
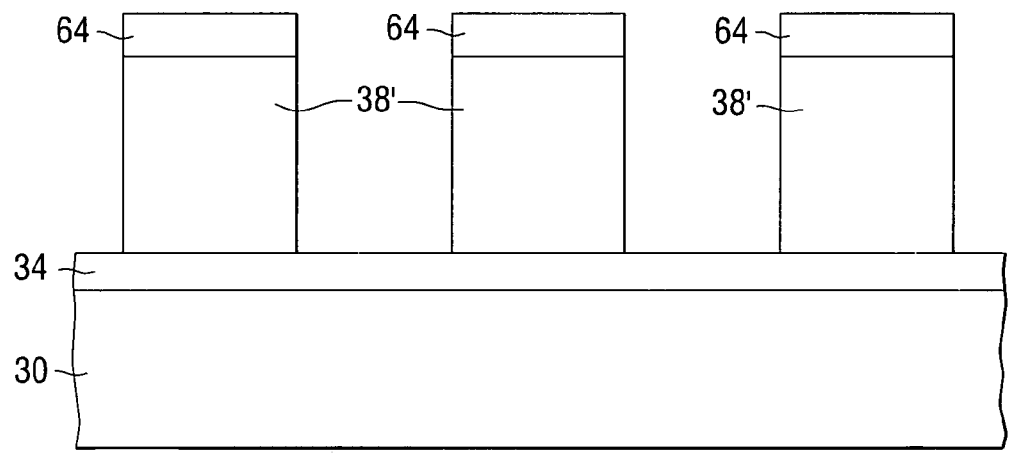
Figure 4C:
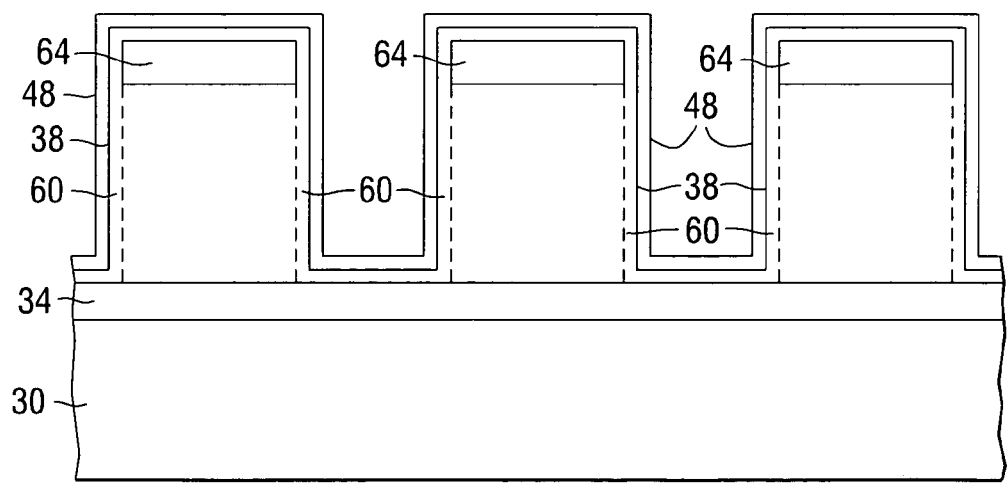
Figure 4D:
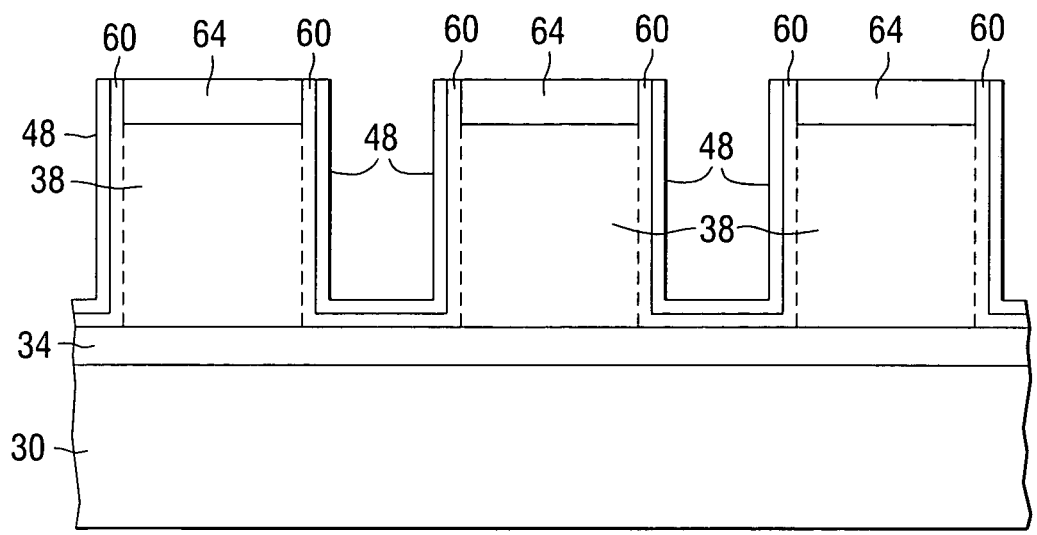
Figure 4E:
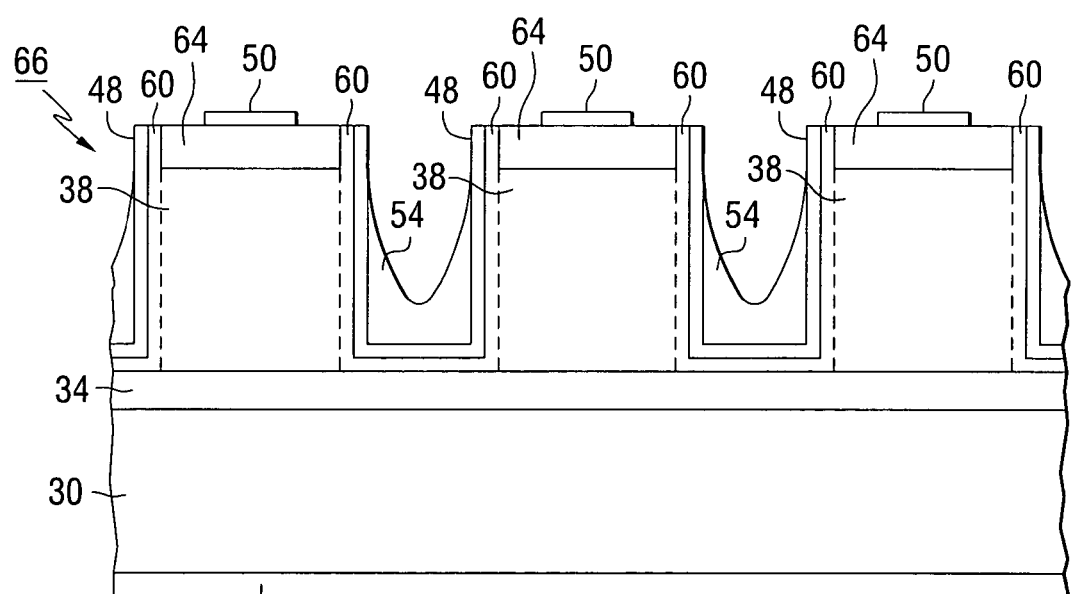

In FIG. 4B the layered structure of FIG. 4A has been removed from the growth apparatus and etched to form pillars 38'. The structure is returned to the growth apparatus and remaining layers are deposited in a single run, and include channel 60 of insulating material, and higher bandgap barrier layer 48, as in FIG. 4C. The top surface of pillars 38 are removed exposing n+GaN regions 64, as in FIG. 4D and appropriate source, drain and gate contacts 50, 52 and 54 are added, resulting in HEMT 66, as in FIG. 4E.

The process steps for fabricating another embodiment of the invention are illustrated in FIGS. 5A to 5D. Basically an alternative fabrication sequence is described wherein the various layers of the HEMT may be deposited in a single run without the necessity of removing the structure from the growth apparatus.

Figure 5A:
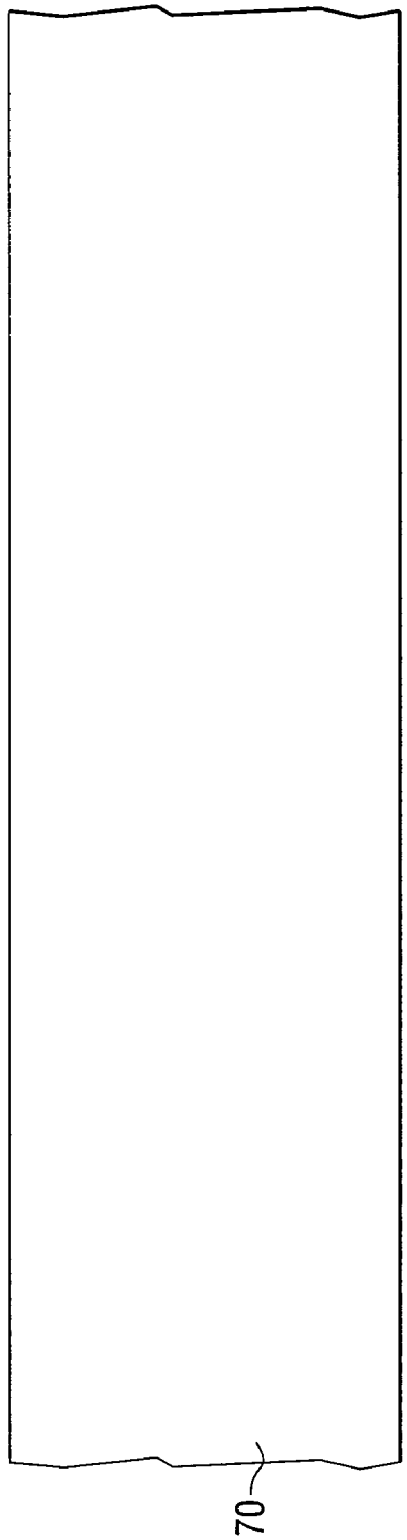
FIGS. 5A to 5D illustrate the fabrication steps for making another embodiment of the present invention.
Figure 5B:
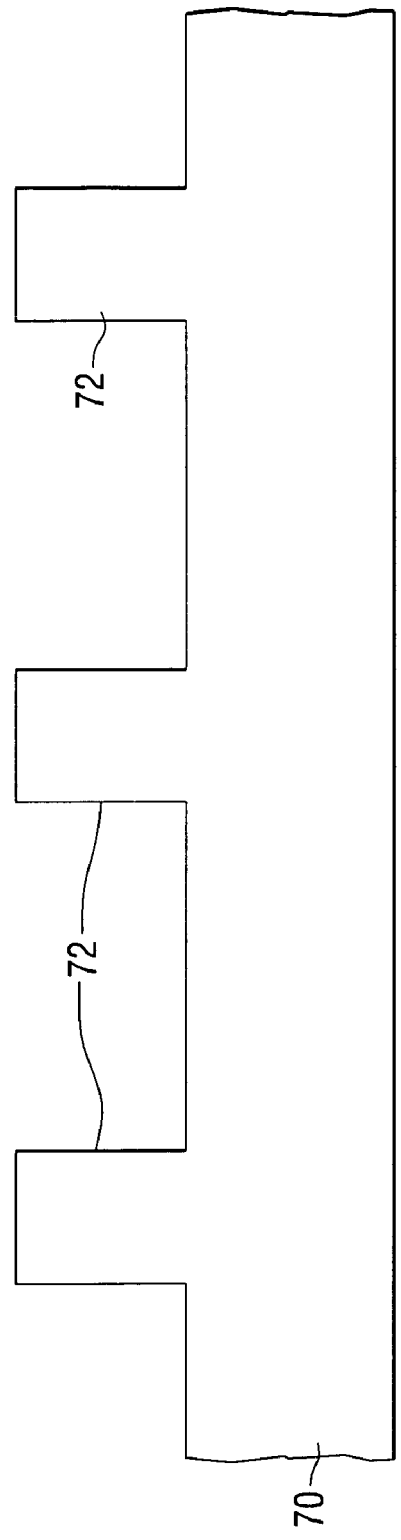
Figure 5C:
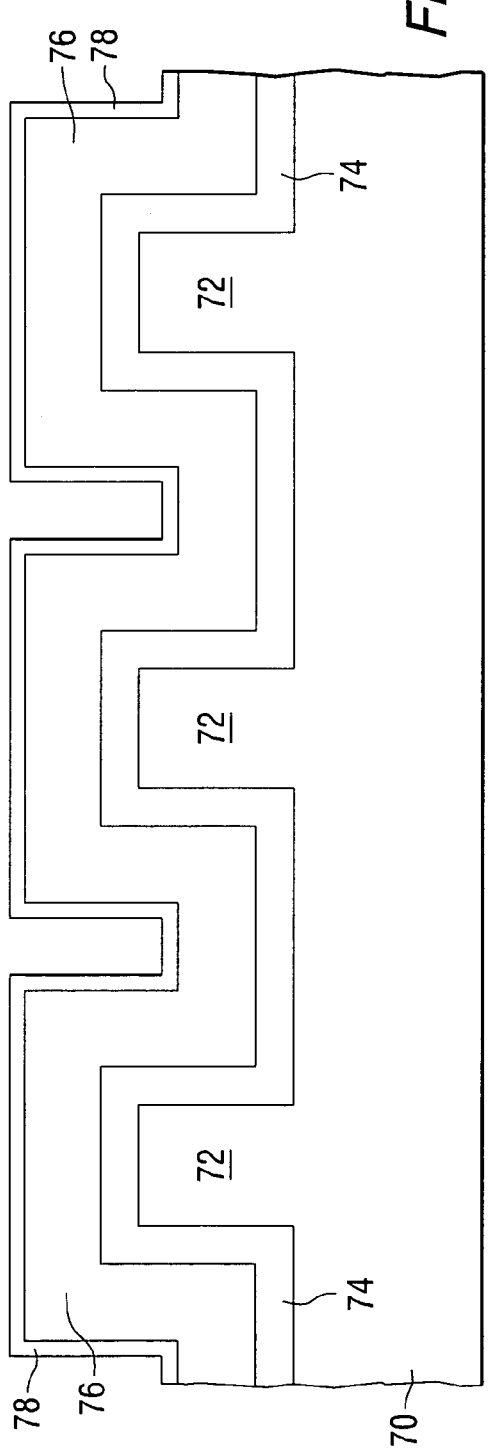
Figure 5D:
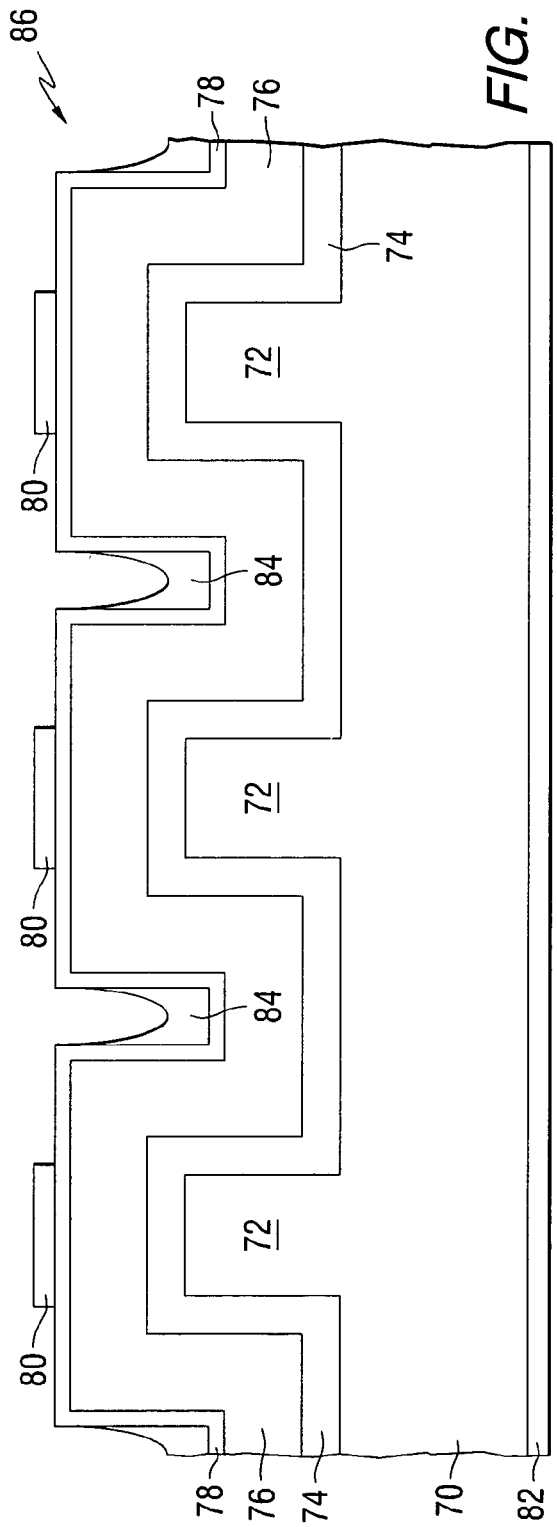

The process starts with a relatively thick substrate member 70 of a first chemical family, SiC, shown in FIG. 5A. A lithographic patterning of substrate 70 is employed to form pillars 72, as in FIG. 5B. Thereafter, the structure is placed in the MOCVD growth apparatus and, as indicated in FIG. 5C, layers of semiconductor of a second chemical family are added and include $Al_xIn_yGa_{(1-x-y)}N$ buffer layer 74, GaN insulating layer 76 and AlGaN barrier layer 78 which are deposited in a single run by adjusting the chemical composition of the gases uses in the growth process, and without removing the structure from the growth apparatus. After the required layers have been deposited, contacts 80, 82 and 84 the source, drain and gate may be added, as in FIG. 5D, resulting in HEMT 86. The advantage of this process is that it reduces intrinsic problems that may be associated with removal and reinsertion of the structure from, and back into, the growth system.

In the foregoing embodiments heteroepitaxial growth is described wherein one type of crystal of one chemical family is grown on a SiC substrate, of a different chemical family. In order to eliminate problems associated with different lattice parameters, different coefficients of expansion, etc., it would be desirable to fabricate the HEMT device using a homoepitaxial growth process wherein the substrate and subsequently deposited films are all of the same chemical family. Such HEMT device may be fabricated by the steps illustrated in FIGS. 3A to 3D or 4A to 4E, but without the requirement for the buffer layer 34. FIGS. 6A to 6E however, illustrate an alternate homoepitaxial fabrication process.

Figure 6A:
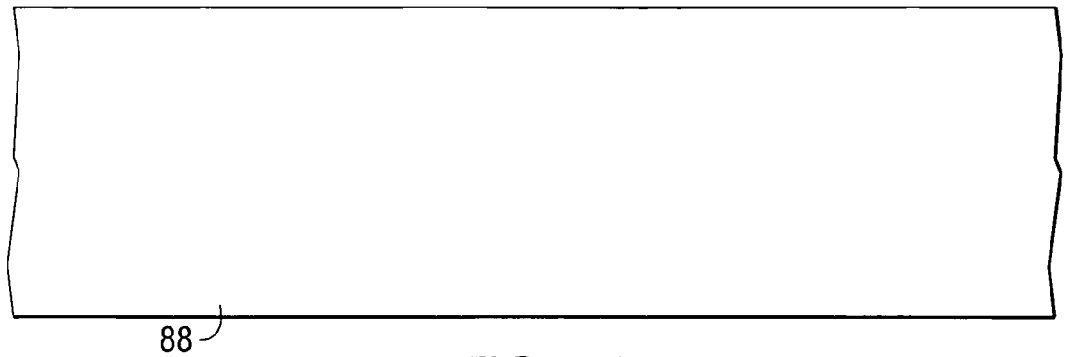
FIGS. 6A to 6F illustrate the fabrication steps for making yet another embodiment of the present invention.

In FIG. 6A numeral 88 is an n+GaN substrate which is ion implanted, such as by iron, vanadium or helium, or the like, in specific regions 90'. The result of this ion implantation is to effectively cause the n+GaN in these adjacent regions 90' to convert to an insulating GaN, as in FIG. 6B. If desired, n+GaN 92 may optionally be deposited as a top layer.

Figure 6B:
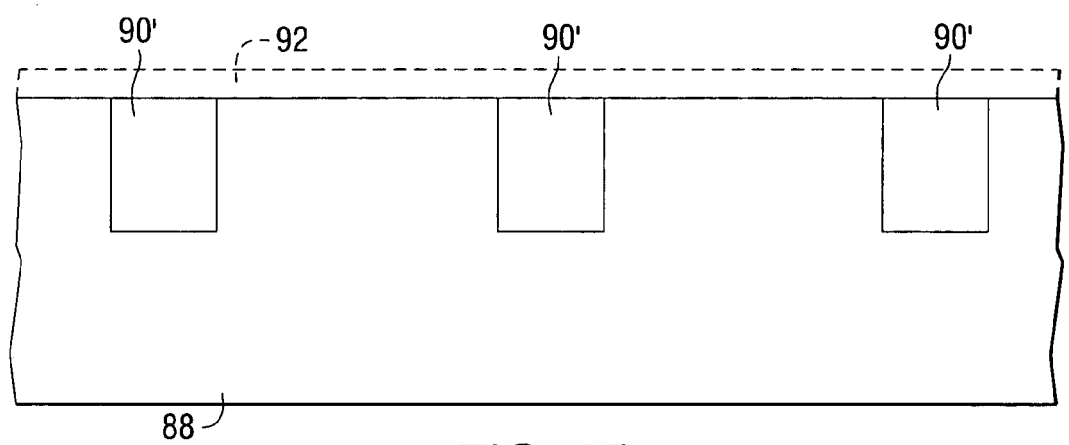
Figure 6C:
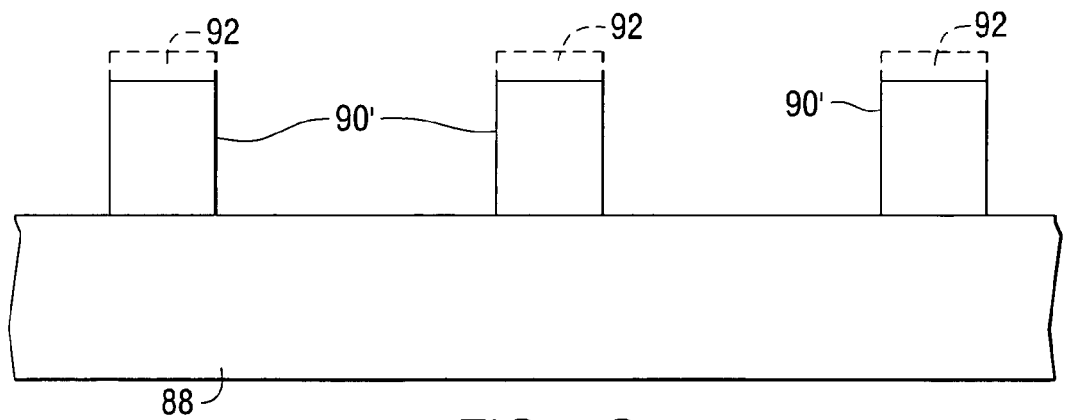
Figure 6D:
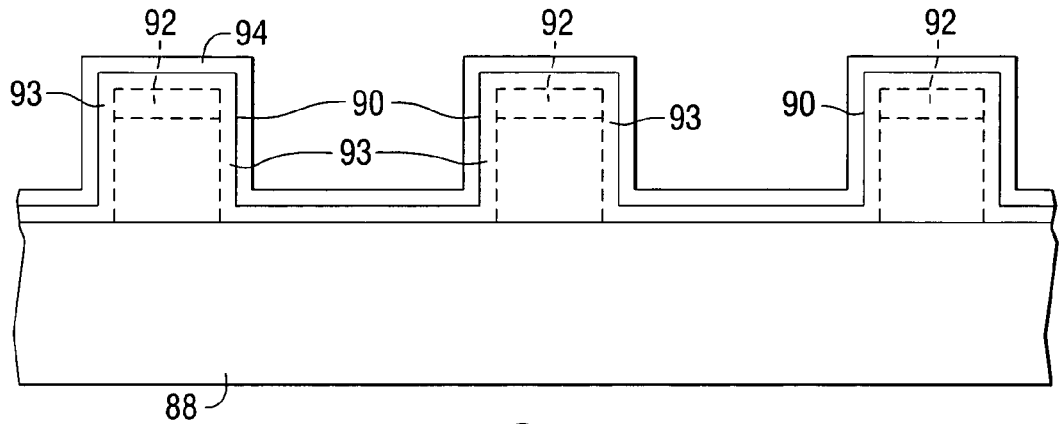

The structure of FIG. 6B is etched, (with or without the n+GaN regions 92, as the case may be) resulting in individual pillars 90' of insulating GaN, seen in FIG. 6C. As illustrated in FIG. 6D the pillars are subjected to a single growth run whereby a relatively thin layer of insulating GaN is grown over the pillars 90', prior to deposition of a barrier layer 94, to form pillars 90, as well as a narrow current conducting channels 93. During the deposition of the relatively thin layer of insulating GaN, the process is adjusted to add Al, to start formation of the AlGaN barrier layer 94.

Figure 6E:
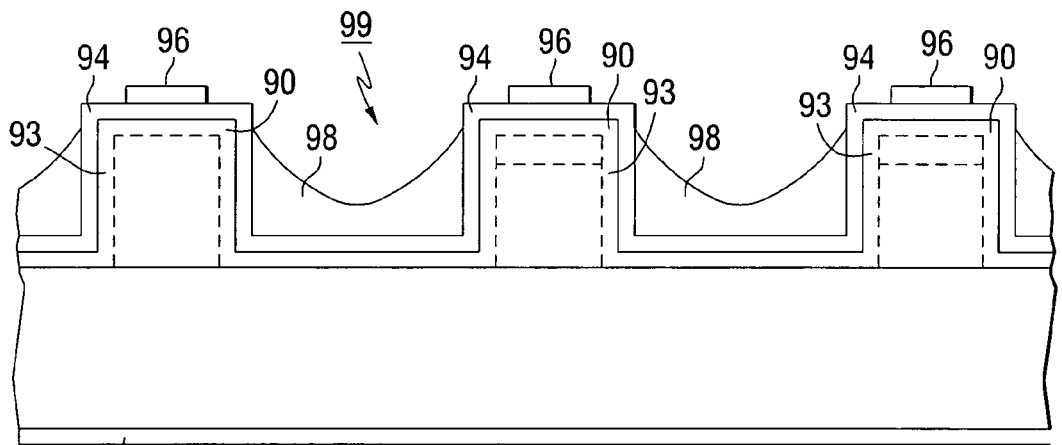

The structure is removed from the growth apparatus and, if the n+ GaN 92 has not been deposited, and as illustrated in FIG. 6E, source contacts 96, drain contact 97 and gate contacts 98 are added to form HEMT device 99.

Figure 6F:
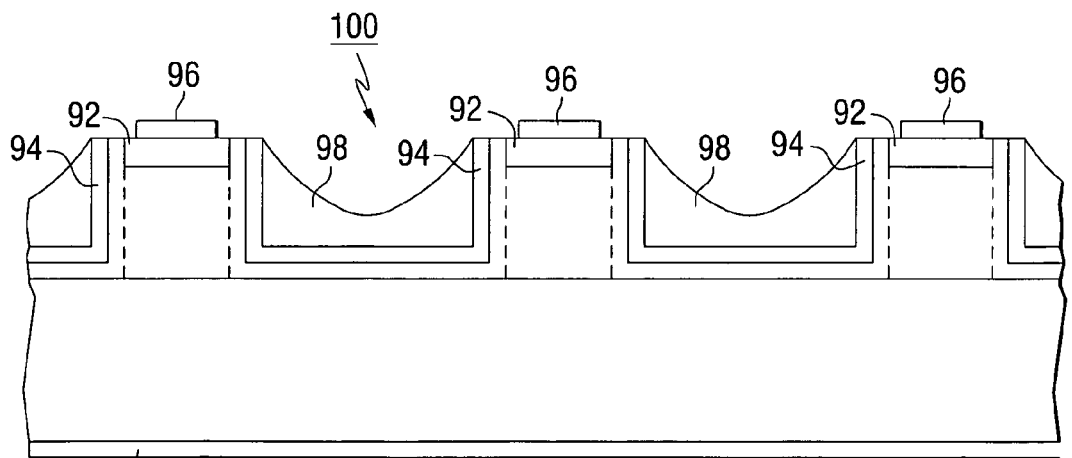

If the n+ GaN 92 has been deposited, and as indicated in FIG. 6F, the tops of the pillars are removed and metal contacts 96 are affixed to the n+ GaN regions 92 at the tops of the pillars. Contacts 97 and 98 are also added, forming HEMT device 100.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of making a HEMT device, comprising the steps of:

depositing a buffer layer on a substrate of a semiconductor material of a first chemical family;

depositing an insulating layer of semiconductor material of a second chemical family on said buffer layer;

forming a plurality of pillars in said insulating layer, with each said pillar having a top, and sidewalls perpendicular to said substrate;

growing a relatively thin layer of additional insulating layer material on said formed pillars;

growing a semiconductor barrier layer of a higher bandgap than that of said insulating layer, over said additional insulating layer;

depositing metal contacts on a) said barrier layer which is on top of said pillars, b) on a surface of said substrate and c) on said barrier layer which is on said side walls of said pillars.

2. A method according to claim 1 which includes:

selecting said substrate from the SiC chemical family;

selecting said insulating layer from the GaN chemical family;

selecting said buffer layer from the GaN chemical family and wherein said buffer layer is given by $Al_xIn_yGa_{(1-x-y)}N$, where $0=x=1$ and $0=y=1$.

3. A method according to claim 1 which includes:

depositing an n+ layer of semiconductor material, of said second chemical family, on said insulating layer, prior to formation of said pillars;

forming a plurality of pillars in said insulating layer with deposited n+ semiconductor material, with each said pillar having a top, and sidewalls perpendicular to said substrate;

growing a relatively thin layer of additional insulating layer material on said formed pillars;

growing a semiconductor barrier layer of a higher bandgap than that of said insulating layer, over said additional insulating layer;

removing said additional insulating layer and said barrier layer from the tops of said pillars to expose said n+ semiconductor material;

depositing metal contacts on a) said exposed n+ semiconductor material, b) on a surface of said substrate and c) on said barrier layer which is on said side walls of said pillars.

4. A method of making a HEMT device, comprising the steps of:

providing a substrate of a semiconductor material of a first chemical family;

forming a plurality of pillars in said substrate;

placing said substrate with said formed pillars in a semiconductor growth apparatus;

growing in succession over said formed pillars and without removing said substrate from said apparatus, a buffer layer, an insulating layer of semiconductor material of a second chemical family and a barrier layer having a higher bandgap than that of said insulating layer, resulting in a structure which has pillars, each with a top and sidewalls covered with said barrier layer;

removing said structure from said growth apparatus and applying metal contacts on a) said barrier layer on said tops of said pillars, b) on a surface of said substrate and c) on said barrier layer on said sidewalls of said pillars.

5. A method according to claim 4 which includes:

growing said structure in an MOCVD growth apparatus.

6. A method of making a HEMT device, comprising the steps of:

providing an n+ substrate of a semiconductor material of a selected chemical family;

converting adjacent regions of said substrate to insulating regions;

removing the material between said insulating regions to form a plurality of adjacent pillars;

growing in succession over said formed pillars, an insulating layer of semiconductor material of said selected chemical family and identical to said insulating regions, and a barrier layer having a higher bandgap than that of said insulating regions, resulting in a structure which has pillars, each with a top and sidewalls covered with said barrier layer;

applying metal contacts on a) said barrier layer on said tops of said pillars, b) on a surface of said substrate and c) on said barrier layer on said sidewalls of said pillars.

7. A method according to claim 6 which includes:

depositing an n+ layer of semiconductor material, of said selected chemical family, on said insulating regions, prior to formation of said pillars;

growing a relatively thin layer of additional insulating layer material on said formed pillars, including said n+ layer of semiconductor material;

growing a semiconductor barrier layer of a higher bandgap than that of said insulating layer, over said additional insulating layer;

removing said additional insulating layer and said barrier layer from the tops of said pillars to expose said n+ semiconductor material;

depositing metal contacts on a) said exposed n+ semiconductor material, b) on a surface of said substrate and c) on said barrier layer which is on said side walls of said pillars.

* * * * *